United States Patent
Hsieh et al.

(10) Patent No.: US 6,818,155 B2
(45) Date of Patent: Nov. 16, 2004

(54) ATTACHING COMPONENTS TO A PRINTED CIRCUIT CARD

(75) Inventors: George Hsieh, Portland, OR (US); Terrance J. Dishongh, Hillsboro, OR (US); Norman J. Armendariz, Hillsboro, OR (US); David V. Spaulding, Banks, OR (US)

(73) Assignee: Intel Corporation, Santa Clara, CA (US)

( * ) Notice: Subject to any disclaimer, the term of this patent is extended or adjusted under 35 U.S.C. 154(b) by 198 days.

(21) Appl. No.: 10/039,300

(22) Filed: Jan. 2, 2002

(65) Prior Publication Data

US 2003/0121602 A1 Jul. 3, 2003

(51) Int. Cl.$^7$ .................. H01L 29/43; H01L 35/24; B32B 31/00; C03C 10/02; C22C 38/00
(52) U.S. Cl. .................. 252/511; 252/518.1; 252/513; 252/62.9 R; 257/746; 257/40; 428/355 N; 438/610; 438/119; 427/550; 427/598; 501/10; 420/8
(58) Field of Search .................. 252/511, 518.1, 252/62.9 R, 513, 62.54, 62.55; 257/746, 40; 428/335 N, 355 N; 438/610, 119; 427/550, 598; 501/10; 420/8

(56) References Cited

U.S. PATENT DOCUMENTS

| 5,545,367 A | * | 8/1996 | Bae et al. .................. 264/401 |
| 5,773,322 A | * | 6/1998 | Weld .................. 438/117 |
| 6,011,307 A | * | 1/2000 | Jiang et al. .................. 257/746 |
| 6,555,762 B2 | * | 4/2003 | Appelt et al. .................. 174/264 |

FOREIGN PATENT DOCUMENTS

| JP | 01-052303 A | * | 2/1989 | .......... H01B/5/16 |
| JP | 09-023049 A | * | 1/1997 | .......... H01B/5/16 |

OTHER PUBLICATIONS

"Process for producing Magnetic Layers" IBM Technical Disclosure Bulletin # NN86123197, Dec. 1986, US.*

* cited by examiner

Primary Examiner—Yogendra N. Gupta
Assistant Examiner—Kallambella Vijayakumar
(74) Attorney, Agent, or Firm—Blakely, Sokoloff, Taylor & Zafman LLP

(57) ABSTRACT

Coupling components to an underlying substrate using a composition of a polymer and magnetic material particles. Upon applying the composition between the component and the printed circuit board, the composition may be subjected to a magnetic field to align the magnetic material particles into a conductive path between the component and the underlying substrate. At the same time the polymer-based material may be cured or otherwise solidified to affix the conductive path formed by the magnetic material particles.

13 Claims, 6 Drawing Sheets

ATTACHING COMPONENTS TO A PRINTED CIRCUIT CARD

BACKGROUND

The present invention relates to circuit components and, in particular, to attaching components to underlying substrates.

BACKGROUND OF THE RELATED ART

There may be several techniques for attaching components, such as an integrated circuit, to underlying substrates, such as printed circuit cards. However, these techniques may have multiple problems. For example, eutectic lead solder may be used to attach a component to an underlying substrate because the eutectic lead solder has a low melting temperature and good viscosity, but environmental regulations may force lead solders to be phased out of manufacturing. Other solders that do not contain lead, including, but not limited to, tin alloys, may be used to connect components to underlying substrates. However, these solders have high melting temperatures that may damage the components or underlying substrates during the process of attaching them together. Other methods of attaching components and underlying substrates, such as cup and cone suspension, may have contact resistance problems between the surfaces of the component and the underlying substrate.

BRIEF DESCRIPTION OF THE DRAWINGS

The invention may best be understood by referring to the following description and accompanying drawings that are used to illustrate embodiments of the invention. In the drawings.

DETAILED DESCRIPTION

The following description makes reference to numerous specific details in order to provide a thorough understanding of the present invention, however, it is to be noted that not every specific detail need be employed to practice the present invention. Additionally, well known details, such as particular materials or methods have not been described in order to avoid obscuring the present invention.

Figure 1:
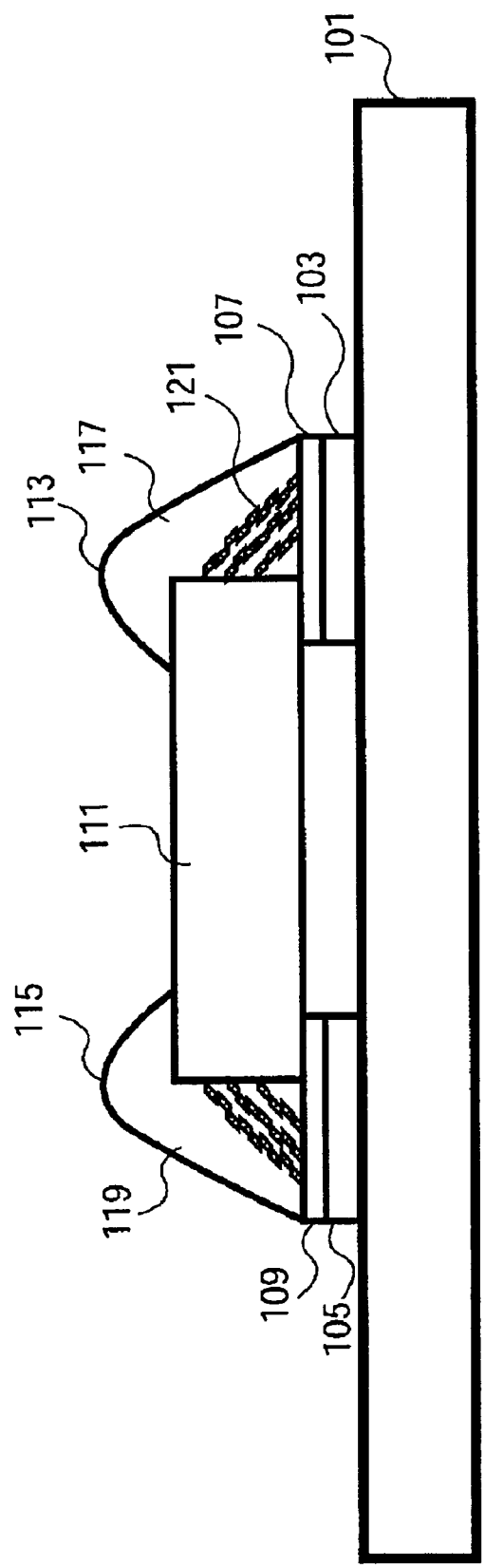
FIG. 1 shows an embodiment of the invention having an underlying substrate coupled to a component by a solidified bi-material composition.

Referring to FIG. 1, an embodiment of the invention is shown in the form of an underlying substrate 101 coupled to a component 111 by a conductive solidified bi-material composition 113 and 115. The bi-material composition 113 and 115 may first be subjected to a magnetic field in order to align the magnetic material particles 121 into a conductive path. The composition 113 and 115 may then be solidified in order to fix the conductive paths of the magnetic material particles 121. The magnetic material particles 121 may form a conductive path through the polymer-based material 117 and 119 from the component 111 to the screen pads 103 and 105 coupled to the underlying substrate 101. The screen pads 103 and 105 may be coated with pre-coating layers 107 and 109.

Figure 2:
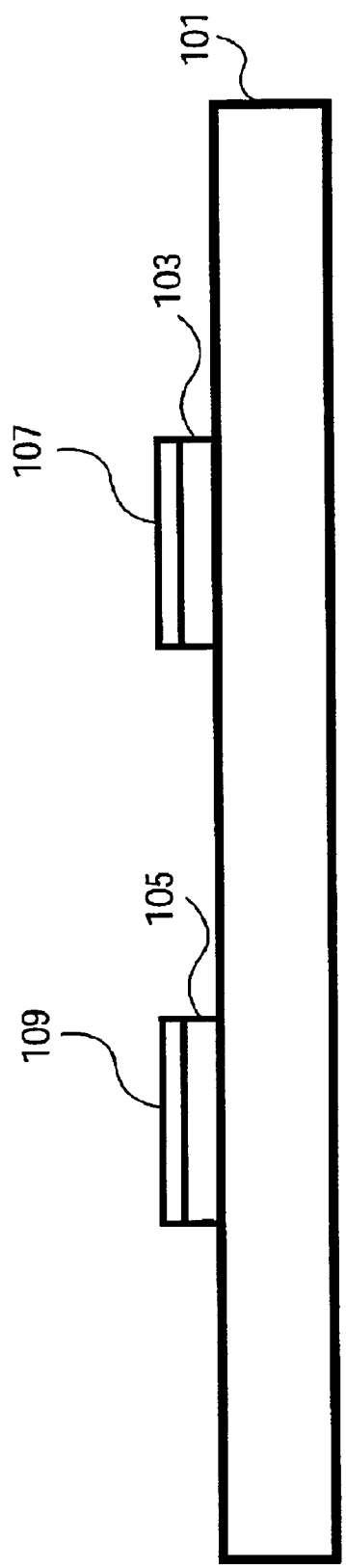
FIG. 2 shows an embodiment of the invention having an underlying substrate and screen pads.

Referring to FIG. 2, an embodiment of the invention is shown in the form of an underlying substrate 101 and screen pads 103 and 105 pre-coated with a conductive composition. The underlying substrate 101 may be a substrate such as, but not limited to, a printed circuit card, an aluminum lead frame, and a fine-pitched ball grid array. A component (not shown) such as, but not limited to, an integrated circuit, may be coupled to the underlying substrate 101 through screen pads 103 and 105 and a bi-material composition (not shown). The screen pads 103 and 105, shown in FIG. 2, may be electrically coupled to the underlying substrate 101. A conductive composition may be used to pre-coat the screen pads 103 and 105 before coupling the component to the underlying substrate 101. In this illustrated embodiment, the conductive composition used to pre-coat the screen pads 103 and 105 is the same bi-material composition used to establish a conductive path between the component and the underlying substrate 101. Pre-coating layers 107 and 109 may make the surface of the screen pads 103 and 105 more adherable for later deposition of the bi-material composition. If the bi-material composition is used for pre-coating layers 107 and 109, it may not be cured or solidified before coupling the component to the underlying substrate 101. While the pre-coating layers 107 and 109 are shown in FIG. 2, in order to perform the invention, the pre-coating layers 107 and 109 may be omitted in some embodiments.

In one embodiment of the invention, the bi-material composition may be formed by mixing a polymer-based material with magnetic material particles. The polymer-based material may be a polymer, including, but not limited to, conductive polymers, thermoplastic polymers, and thermoset polymers. Some specific polymer-based materials that may be used include, but are not limited to, polyamide, ultraviolet light curable epoxies, and photo-resist polymers. In one embodiment, a polymer-based material, such as but not limited to photo-resist, may have approximately the same coefficient of thermal expansion as the underlying substrate 101. Having approximately the same coefficient of thermal expansion may increase the reliability of the interface between the polymer-based material of the bi-material composition and the underlying substrate 101. Otherwise, the greater the difference between the coefficients of thermal expansion between polymer-based material and the underlying substrate 101, the greater the difference of contraction or expansion between the two during temperature changes and correspondingly, more fatigue may be experienced at the interface between polymer-based material and the underlying substrate 101.

The magnetic material particle may be a material, including, but not limited to, ferro-magnetic metal, magnetic ceramics, and ferro-electric materials. Materials that may be used, include, but are not limited to, iron, barium strontium titanate, strontium tantalum oxide, and peroskovites. In addition, magnetic material particles may be made out of magnetite or metallic materials with low magnetic retentivity. Magnetic material particles may be small in size and acicular shaped (i.e. with a high aspect ratio morphology). In one embodiment, the approximate dimensions of a magnetic material particle may be one micron by two microns by ten microns. However, other dimensions may also be within the scope of the invention.

Several by-weight ratios of the polymer-based material and magnetic material particles in the bi-material composition are within the scope of the invention. For example, in one embodiment, the polymer-based material may constitute approximately 40% by weight of the bi-material composition, while the magnetic material particles may constitute approximately 60% by weight. Other by-weight percentages may be used, depending on several factors, including, but not limited to, the type of polymer-based material, the type of magnetic material particles used, and the size of the magnetic material particles used.

Magnetic material particles may need to be mixed uniformly into the polymer-based material. Therefore, if the polymer is a thermoplastic, the polymer may be in liquid form when mixed with the magnetic material particles, and if the polymer is a thermoset polymer, the polymer may be in a soft, or liquid, uncured form when mixed with the magnetic material particles. After forming the bi-material composition by mixing the polymer-based material and the magnetic material particles together, the bi-material composition may be put through a screen onto the screen pads. The screen may act as a stencil to control the volume and placement of the bi-material composition onto the underlying substrate 101. To put the bi-material composition through the screen, the holes in the screen may be lined up with the areas or components where the bi-material composition is to be deposited, and a squeegee may be used to push it through the screen in a screen printing process. The screen may allow the location and amount of bi-material composition being deposited to be controlled. Other methods of putting the bi-material composition through the screen, including, but not limited to, pulling the bi-material composition through the screen with a magnet or vacuum, may also be within the scope of the invention. Other methods of depositing the bi-material composition into a pre-coating layer 107 and 109 on the screen pads 103 and 105 may also be within the scope of the invention. For example, in one embodiment, the bi-material composition may be deposited directly without the use of a screen.

Figure 3:
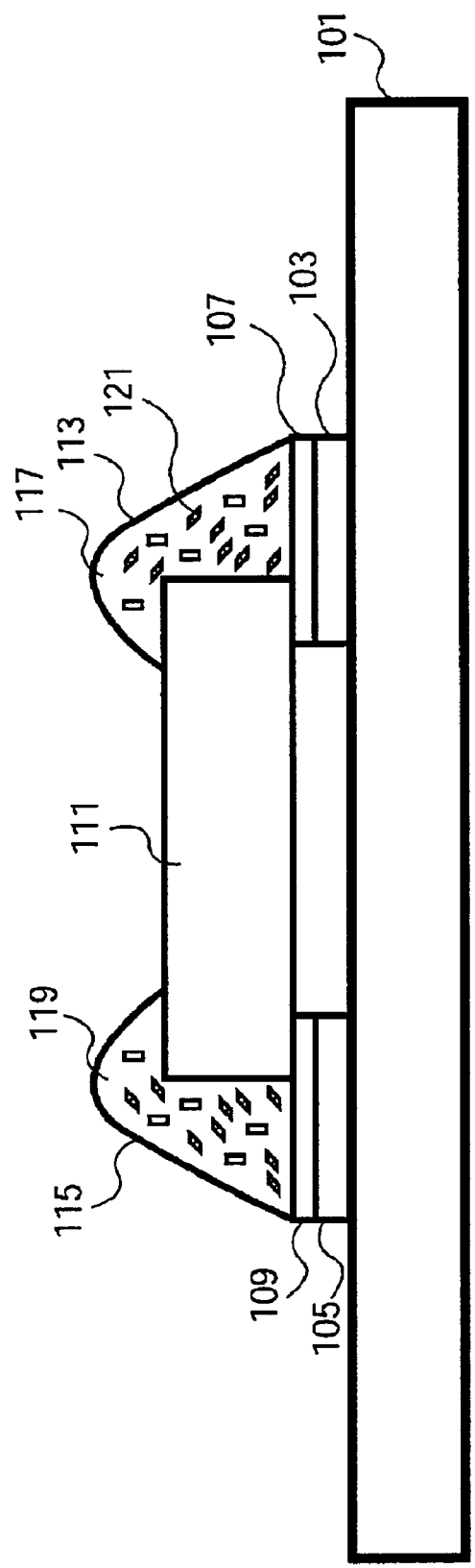
FIG. 3 shows an embodiment of the invention having an underlying substrate, a component, and a non-solid bi-material composition.

Referring to FIG. 3, an embodiment of the invention is shown in the form of an underlying substrate 101, a component 111, and a non-solid bi-material composition 113 and 115. The underlying substrate 101 may be coupled to screen pads 103 and 105. The bi-material composition 113 and 115 may be used to form a pre-coating layer 107 and 109 on the screen pads 103 and 105. The bi-material composition 113 and 115 may be deposited on the screen pads 103 and 105 before the component 111 is placed on the underlying substrate 101. In another embodiment of the invention, the component 111 may be placed onto the screen pads 103 and 105 before the bi-material composition 113 and 115 is deposited. In addition, while the bi-material composition 113 and 115 is shown on the side and on top of the component 111 in the illustrated embodiment of FIG. 3, in another embodiment, the bi-material composition 113 and 115 may be confined to the sides or confined to the sides and bottom of the component 111. When first deposited, the bi-material composition 113 and 115 may be in a liquid state with magnetic material particles 121 in random arrangement in the polymer-based material 117 and 119.

Figure 4:
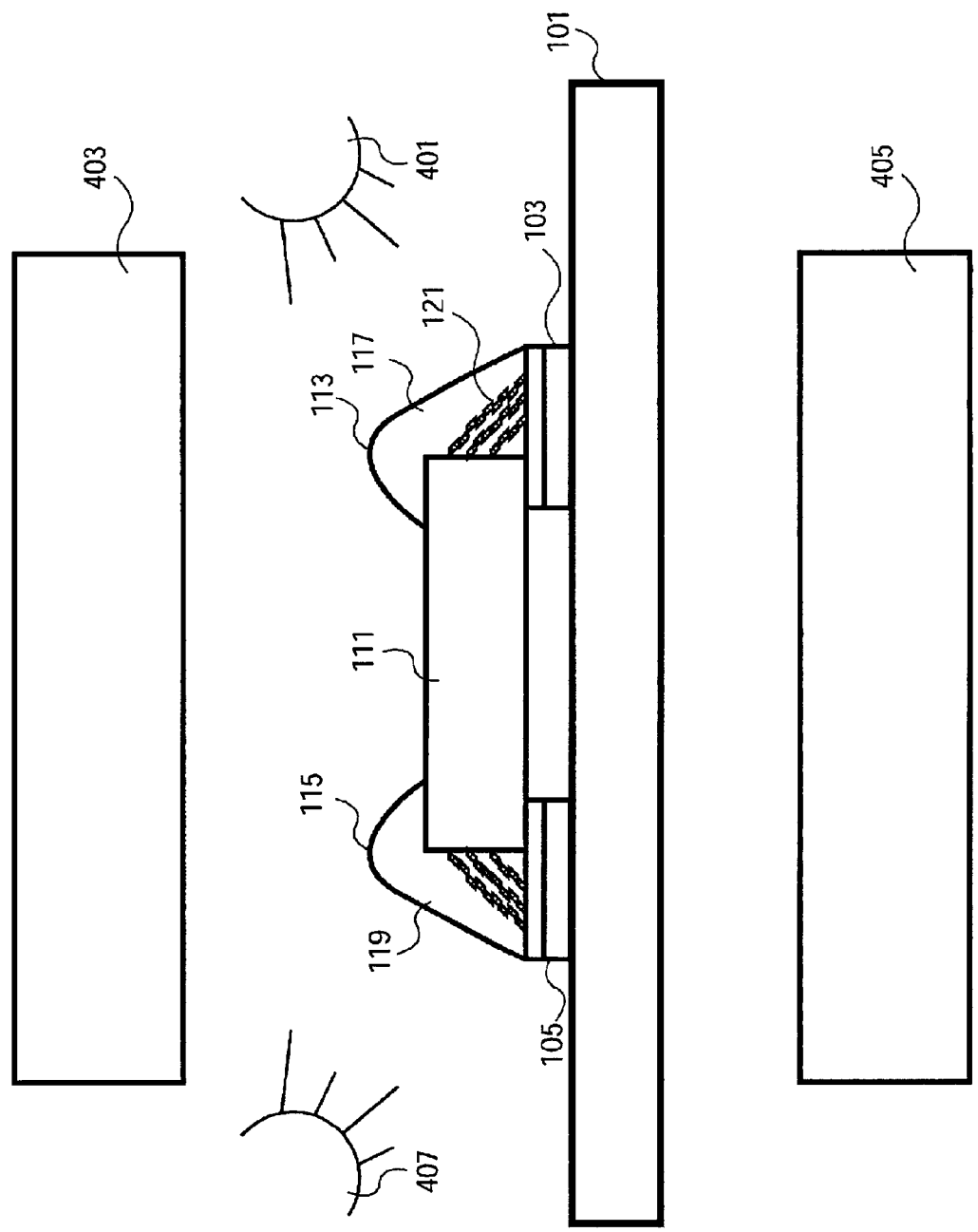
FIG. 4 shows an embodiment of the invention in the form of an underlying substrate, a component, and a bi-material composition in the presence of a magnetic field and ultraviolet light.

Referring to FIG. 4, an embodiment of the invention is shown in the form of a underlying substrate 101, a component 111, and a bi-material composition 113 and 115 being exposed to a magnetic field and UV light. In the embodiment shown in FIG. 4, an underlying substrate 101 may be coupled to a component 111 through screen pads 103 and 105 by a bi-material composition 113 and 115 with magnetic material particles 121. Upon application of the magnetic field, which may be provided by magnets 403 and 405, the magnetic material particles 121 may group and align with each other to form a magnetic material particle path. The magnetic material particles 121 in the bi-material composition 113 and 115 may be acicular in shape. The magnetic material particles 121 may be long, thin, and flat to increase the number of surface contact points that may improve the conductive path formation.

The magnetic field strength used may be less than a level that may cause sensitive devices on or near the underlying substrate 101 to be affected by soft errors. For example, while a weaker magnetic field may be needed near central processing units, a stronger magnetic field may be used for passive components such as capacitors and resistors. While magnets 403 and 405 are shown to supply the magnetic field, other sources of magnetic fields including, but not limited to natural magnets and electro-magnets, may also be within the scope of the invention.

A secondary magnetic attraction from metallic surfaces on the component 111 may bend the magnetic material particle path enough to form a conductive path between component 111 and screen pads 103 and 105. In the context of the invention, 'bend' means that the lines of magnetic flux are affected by the secondary magnetic attraction from metallic surfaces, so that the magnetic material particle path is directed to the metallic surfaces of component 111.

While the magnetic field is being applied, a UV light from a UV light source, such as UV light sources 401 and 407, may be applied to the bi-material composition 113 and 115. While the UV light 401 and 407 cures the bi-material composition 113 and 115, causing it to stiffen, the magnetic material particles 121, under the influence of the magnetic field, may form conductive paths and eventually be trapped in the solidified polymer-based material in conductive pathways between the component 111 and the screen pads 103 and 105.

While UV lights 401 and 407 are shown in the embodiment of the invention, other lights such as, but not limited to, regular light and infrared light, may also be used to cure the polymer-based material 117 and 119 in the bi-material composition 113 and 115. Heat sources may also be used to cure the polymer-based material 117 and 119 by increasing the polymer-based material's temperature. In addition to using lights 401 and 407 or heat sources, the polymer-based material 117 and 119 may also be cured by using a curing agent mixed into the bi-material composition 113 and 115 at the time the magnetic field is applied. Other methods of curing the polymer-based material 117 and 119 may also be within the scope of the invention. In other embodiments of the invention, the polymer-based material 117 and 119 may be a thermoplastic polymer. For thermoplastic polymers, instead of applying UV lights 401 and 407 or a curing agent, a heat source may used to liquefy the polymer-based material 117 and 119 and then the heat source may be removed. In another embodiment of the invention, the thermoplastic polymer may be solidified by lowering its temperature.

Several factors may also affect the formation of conductive paths between the component 111 and the screen pads 103 and 105. For example, the viscosity of the polymer-based material 117 and 119, the density of the magnetic material particles 121, the shape of the magnetic material particles 121, the distribution of the magnetic material particles 121, the concentration of the magnetic material particles 121 in the bi-material composition 113 and 115, and the temperature conditions during the application of the magnetic field may affect the speed at which the magnetic material particles 121 align and form a conductive path between the component 111 and the underlying substrate 101.

For example, if the viscosity of the bi-material composition 113 and 115 is too high, the magnetic material particles 121 may not be able to move into alignment before the polymer-based material 117 and 119 solidifies. However, if the viscosity of the bi-material composition 113 and 115 is too low, the magnetic material particles 121 may move quickly into position and then slightly disjoin in a random alignment according to the magnetic field. The higher the viscosity of the polymer-based material 117 and 119, the higher the attraction force may be between close adjacent magnetic material particles 121. However, with a low viscosity polymer-based material 117 and 119, the magnetic material particles 121 may be more influenced by the magnetic force of the magnets 403 and 405 than the attraction force between them and may be slightly pulled away from each other to align with the magnetic field. In a high viscosity polymer-based material 117 and 119, the magnetic material particles 121 may have a stronger attraction at close range than the magnetic force pulling them into alignment. The viscosity of the bi-material composition 113 and 115 may need to be adjusted to allow the attraction between each magnetic material particle 121 to influence the magnetic material particles 121 into forming a path and bending between the component 111 and the screen pads 103 and 105. Similar problems may occur if the shapes of the magnetic material particles 121 are too big or too small or if their density and concentration is too great or too small.

Figure 5:
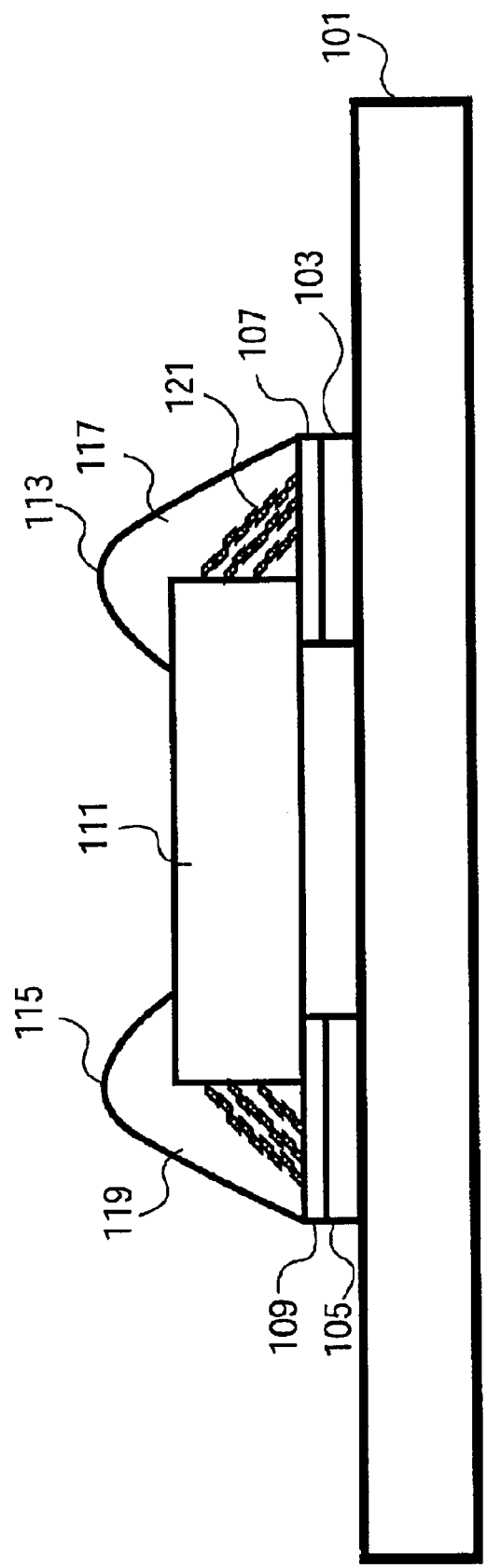
FIG. 5 shows an embodiment of the invention having an underlying substrate coupled to a component by a solidified bi-material composition.

Referring to FIG. 5, an embodiment of the invention is shown in the form of an underlying substrate 101 coupled to a component 111 by a conductive solidified bi-material composition 113 and 115. In the embodiment shown in FIG. 5, the bi-material composition 113 and 115 may be subjected to a magnetic field in order to align the magnetic material particles 121 into a conductive path. Then the composition 113 and 115 may be solidified in order to fix the conductive paths of the magnetic material particles 121. The magnetic material particles 121 may form a conductive path through the polymer-based material 117 and 119 from the component 111 to the screen pads 103 and 105 coupled to the underlying substrate 101.

While one component 111 is shown in the embodiment in FIG. 5, multiple components may be coupled to the underlying substrate 101 using the invention. Components 111 may be applied at the same time, or the components 111 may be applied one at a time. In another embodiment of the invention, the components 111 may be applied in shifts, by which a selected type of component 111 is applied to the underlying substrate 101 in each shift. While setting the bi-material composition 113 and 115 on the selected type of components 111, a magnetic field with a strength sufficient for the specific amount and type of bi-material composition 113 and 115 used with the selected components 111 may be applied at approximately the same time the polymer-based material 117 and 119 is solidified. For example, bigger components 111 may require more bi-material composition 113 and 115 to form the appropriate conductive connections, and with bigger components 111, there may be more bi-material composition 113 and 115 to solidify and more magnetic material particles 121 to align. The magnetic field strength and method of solidifying the polymer-based material 117 and 119 may need to be adjusted for the components 111 using a greater amount of bi-material composition 113 and 115. After the conductive connections are formed in the bi-material composition 113 and 115, the component connection to the underlying substrate 101 may be electrically tested.

Figure 6:
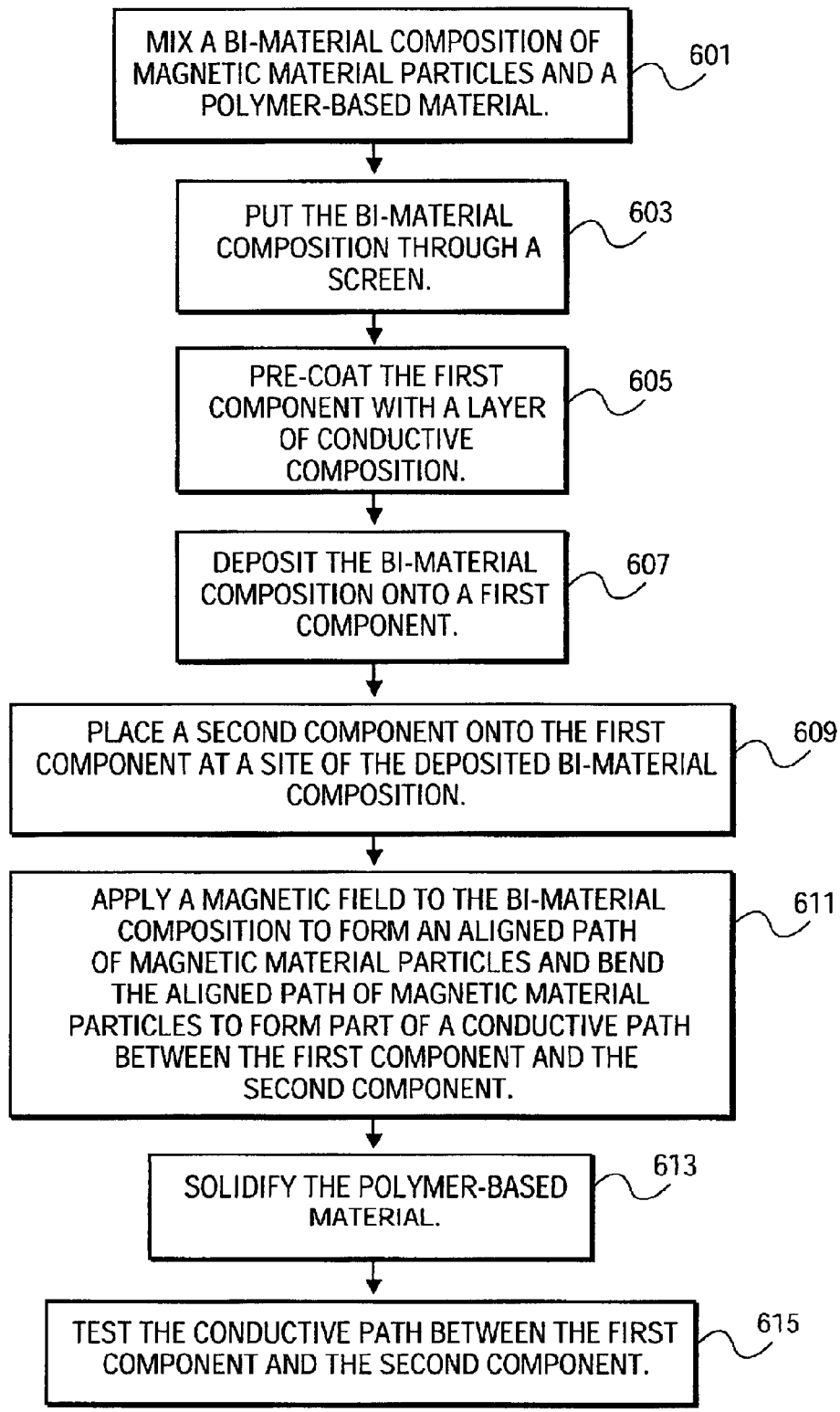
FIG. 6 shows an embodiment of the invention in the form of a flowchart of a method for forming the conductive path between the component and the underlying substrate.

Referring to FIG. 6, a flowchart of a method of an embodiment of the invention is shown for electrically coupling a first component to a second component. At block 601, a bi-material composition of magnetic material particles and a polymer-based material may be mixed. At block 603, the bi-material composition may be put through a screen. At block 605, a first component, such as, but not limited to, an underlying substrate, may be pre-coated with a layer of conductive composition. At block 607, the bi-material composition may be deposited on a first component. At block 609, a second component may be placed onto a first component at the site where the bi-material composition is deposited. At block 611, a magnetic field may be applied to the bi-material composition to form an aligned path of the magnetic particles and bend said aligned path of magnetic material particles to form part of a conductive path between the first component and the second component. At block 613, the polymer-based material may be solidified. For example, a curing compound or UV light source may be applied if the polymer-based material is a thermoset polymer. At block 615, after the polymer-based material has been solidified and the magnetic material particles have been fixed in the bi-material composition, the conductive path formed by the magnetic material particles between the first component and the second component may be tested.

Although an exemplary embodiment of the invention has been shown and described in the form of a method for attaching components to an underlying substrate, many changes, modifications, and substitutions may be made without departing from the spirit and scope of the claimed invention.

We claim:

1. An apparatus comprising:

a polymer-based material; and a plurality of magnetically aligned magnetic material particles in said polymer-based material to form an electrically conductive path through a part of said polymer-based material, wherein the dimensions of the said magnetic material particles are approximately one micron by two microns by ten microns.

2. The apparatus of claim 1 wherein said polymer-based material is selected from a group consisting of conductive polymers, thermoplastic polymers, and thermoset polymers.

3. The apparatus of claim 1 wherein said polymer-based material is a polyamide.

4. The apparatus of claim 1 wherein said polymer-based material is an ultra-violet light curable epoxy.

5. The apparatus of claim 1 wherein said magnetic material is selected from a group consisting of ferro-magnetic metal, a magnetic ceramic, and a ferro-electric material.

6. The apparatus of claim 1 wherein said apparatus is comprised of approximately 40 percent by weight polymer-based material and approximately 60 percent by weight magnetic material particles.

7. The apparatus of claim 1 wherein said magnetic material particles are acicular shaped.

8. The apparatus of claim 1 wherein said polymer-based material is a photo-resist material.

9. The apparatus of claim 1 wherein said magnetic material particles form part of the electrically conductive path from the integrated circuit to the underlying substrate.

10. The apparatus of claim 1 wherein said magnetic material is selected from a group consisting of iron, barium strontium titanate, strontium tantalum oxide, and perovskites.

11. An apparatus comprising:

a polymer-based material; and a plurality of magnetically aligned, magnetic material particles in said polymer-based material to form an electrically conductive path through a part of said polymer-based material, wherein the said magnetic material is selected from a group consisting of barium strontium titanate, strontium titanium oxide and perovskites.

12. The apparatus of claim 11 wherein said polymer-based material has a first coefficient of thermal expansion and interconnects an integrated circuit and an underlying substrate having a second coefficient being approximately the same as the first coefficient of thermal expansion.

13. The apparatus of claim 12 wherein said magnetic particles form part of the electrically conductive path from the integrated circuit to the underlying substrate.

* * * * *